United States Patent [19]
Seshan et al.

[11] Patent Number: 5,977,639
[45] Date of Patent: *Nov. 2, 1999

[54] METAL STAPLES TO PREVENT INTERLAYER DELAMINATION

[75] Inventors: Krishna Seshan, San Jose; Neal R. Mielke, Los Altos Hills, both of Calif.

[73] Assignee: Intel Corporation, Santa Clara, Calif.

[ * ] Notice: This patent is subject to a terminal disclaimer.

[21] Appl. No.: 08/940,304

[22] Filed: Sep. 30, 1997

[51] Int. Cl.⁶ .......................... H01L 23/48; H01L 23/52; H01L 29/40

[52] U.S. Cl. .......................... 257/776; 257/758; 257/773; 257/723; 257/620; 257/700; 257/734

[58] Field of Search ..................... 257/734, 700, 257/758, 774, 773, 771, 765, 762, 776, 620, 723

[56] References Cited

U.S. PATENT DOCUMENTS

| | | | |
|---|---|---|---|
| 4,409,724 | 10/1983 | Tasch, Jr. et al. | 257/72 |
| 5,023,699 | 6/1991 | Hara et al. | 257/700 |
| 5,106,461 | 4/1992 | Volfson et al. | 205/125 |
| 5,184,206 | 2/1993 | Neugebauer et al. | 257/762 |
| 5,262,336 | 11/1993 | Pike, Jr. et al. | 257/133 |
| 5,270,256 | 12/1993 | Bost et al. | 438/665 |
| 5,311,061 | 5/1994 | Sheck | 257/797 |
| 5,365,103 | 11/1994 | Brown et al. | 257/758 |
| 5,548,134 | 8/1996 | Tailliet | 257/362 |
| 5,596,213 | 1/1997 | Lee | 257/316 |
| 5,739,587 | 4/1998 | Sato | 257/773 |
| 5,757,060 | 5/1998 | Lee et al. | 257/773 |
| 5,811,874 | 9/1998 | Lee | 257/669 |
| 5,847,466 | 12/1998 | Ito et al. | 257/755 |
| 5,856,705 | 1/1999 | Ting | 257/758 |
| 5,880,528 | 3/1999 | Seshan et al. | 257/758 |

*Primary Examiner*—Alexander Oscar Williams
*Attorney, Agent, or Firm*—Blakely, Sokoloff, Taylor & Zafman LLP

[57] ABSTRACT

The present invention provides in one embodiment thereof an integrated circuit (IC) that includes silicon substrate. The integrated circuit includes a plurality of dielectric and metal layers formed upon the silicon substrate. The plurality of dielectric and metal layers form a die active area. The metal have formed therein a first guard wall surrounding the die active area. The metal layers further have formed therein a second segmented guard wall. The segmented guard wall surrounds and staples the plurality of metal layers. The IC also includes a passivation layer adhering to the first and the segmented guard walls.

20 Claims, 12 Drawing Sheets

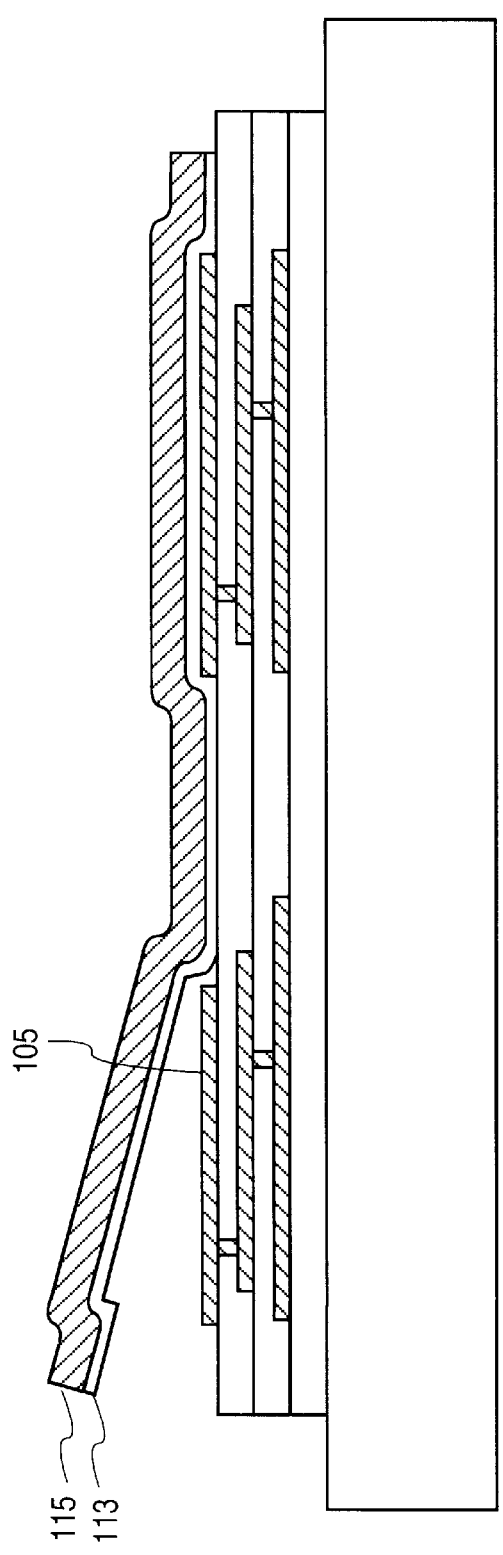
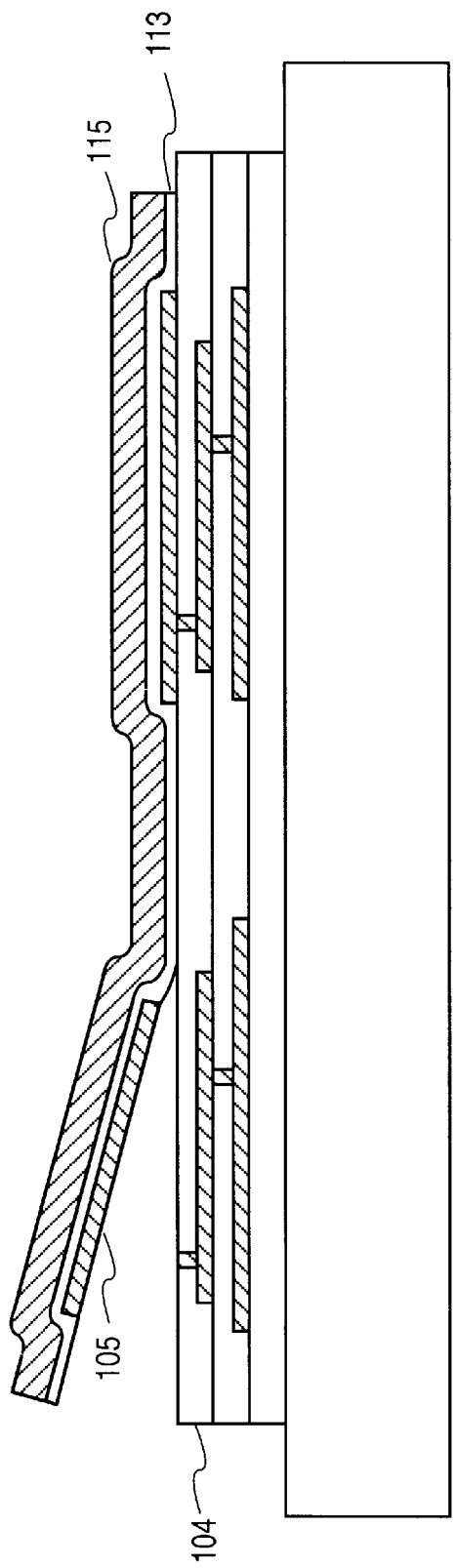
FIG. 2B (Prior Art)
FIG. 2C (Prior Art)

METAL STAPLES TO PREVENT INTERLAYER DELAMINATION

BACKGROUND OF THE INVENTION (1) Field of the Invention

The present invention relates to the field of semiconductor fabrication. More specifically, the present invention relates to integrated circuits with structures that reduce or prevent damages to the integrated circuit.

(2) Background Information

Presently, semiconductor integrated circuits are manufactured by deposition and etch of a number of layers upon a silicon (Si) wafer. Device regions are formed within the Si wafer and then layers of conductive and non conductive material are formed over the device regions. These layers are then masked and etched to form semiconductor devices which are then connected by the use of conductive layers. The conductive layers typically include metal layers which are deposited, masked and etched to form interconnects. Subsequent layers are formed so as to define additional devices and interconnects. A top dielectric layer (hereinafter referred to as "passivation layer") is typically deposited over a top metal layer (hereinafter referred to as "terminal metal layer" or "TML") to planarize, insulate, prevent moisture penetration, thin film cracking, and other types of mechanical and chemical damages which may occur during assembly, packaging and operation of the individual integrated circuit die on the wafer.

FIG. 1 shows a cross-sectional view through a semiconductor wafer 100. Semiconductor wafer 100 includes a silicon substrate 101 that has several dielectric layers 102, 103 and 104 formed thereupon by processes that are well-known in the art. The figure also shows three metal layers that have been deposited, masked, and etched to form metal layers 105, 106, and 107. Metal layers 105–107 overlie device regions to connect the various devices and the subsequently deposited metal layers. A top dielectric layer 111 (passivation layer) is then formed over the terminal metal layer 105 to planarize, insulate the electrical devices and interconnects, to prevent leakage of electrical current through this passivation layer, etc. The passivation layer 111 may include a hard passivation layer 113 typically made of silicon nitride (SiN) and a soft passivation layer typically made of polyimide 115. The polyimide layer covers the SiN layer. The soft passivation layer is deposited by Plasma Enhanced Chemical Vapor Deposition or other typically known passivation layer deposition processes. The layer of silicon nitride is then covered by polyimide or another type of soft passivation layer.

FIG. 2(a) illustrates a cross-section through the semiconductor wafer of FIG. 1 where the soft passivation layer 115 is partly delaminated from the hard passivation layer 113. The delamination typically allows for penetration of moisture and other impurities to penetrate in the semiconductor wafer. One reason for the passivation layer's delamination is that the die is assembled into a plastic package which is more conducive to propagation of external forces within the package and to the die. The passivation layer, may also delaminate, when the die and the passivation layer are subjected to pressure pot testing (steam at a pressure greater than atmospheric pressure). One theory explaining this type of delamination is that steam dissolves or weakens the bonds within the passivation layer causing the passivation layer itself to delaminate.

Delamination is more likely to occur at the interface between the passivation layer 111 and the terminal metal layer 105. Delamination typically starts at the edge of the die and propagates towards the center of the die. If the delamination reaches an electrical interconnect, the forces within the die, that cause the delamination, are applied to the electrical interconnect causing the electrical interconnect to rip apart at weak points thereof.

FIG. 2(b) illustrates another cross section of the semiconductor wafer of FIG. 1 where the polyimide layer 115 delaminates together with the silicon nitride layer 113.

FIG. 2(c) illustrates a cross section of the semiconductor wafer of FIG. 1 where the terminal metal layer 105 and the passivation layer 111, including the silicon nitride layer 113 and the polyimide layer 115, delaminate from dielectric layer 104 as a result of external forces applied to the semiconductor wafer of FIG. 1.

What is needed is to provide a silicon wafer with reduced delamination of the passivation layer from the terminal metal layer, reduced delamination of the terminal metal layer and the passivation layer from a dielectric layer, and reduced delamination of the soft passivation layer from the hard passivation layer.

FIG. 3 illustrates a cross sectional view of a semiconductor wafer that has two chips 302 and 304 formed therein. These chips are separated by a sawing process. The sawing process, in this example, cuts the silicon substrate and all of the overlying layers to form the two chips 302 and 304.

FIG. 4 illustrates a top view of four dies 410 of a wafer separated therebetween by cuts resulting from a sawing process. Each die 410 has an active area 401 demarcated by dotted edge 421. Each die also includes, at a periphery thereof, a guard ring 412 surrounding the die area. Modern silicon wafers are typically provided, for each die, with a guard ring or guard wall that surrounds a die active area and that protects the die active area from damages. The damages include invasion by foreign impurities, such as sodium and magnesium that are existent in the environment, certain mechanical damages, including microcracks, produced by the wafer saw process and that propagate into an active die area of the chip, etc.

Saw cuts through the silicon wafer are typically not straight but rather wavy as shown in the figure (vertical cut 411 and horizontal cut 413). Also, the space between the dies through which the cut is made, is relatively small to provide more chips per wafer (package integration). Therefore, often, the saw cut may be made partially through the guard ring 412 as shown in the figure at 408 and 409. Cuts through the guard ring may cause failure of the guard ring to adequately protect the die active area and damages to the die active area 401 may ensue. Moreover, saw damage combined with reliability testing, (steam, temperature cycling, etc.) tend to cause the multi-layer structures of the silicon wafer to delaminate. It is desirable to provide a wafer that reduces the possibility of sawing cuts through the guard wall. It is also desirable to provide a way of preventing interlayer delamination.

SUMMARY OF THE INVENTION

The present invention provides in one embodiment thereof an integrated circuit (IC) that includes silicon substrate. The integrated circuit includes a plurality of dielectric and metal layers formed upon the silicon substrate. The plurality of dielectric and metal layers form a die active area. The metal have formed therein a first guard wall surrounding the die active area. The metal layers further have formed therein a second segmented guard wall. The segmented guard wall surrounds and staples the plurality of metal layers. The IC also includes a passivation layer adhering to the first and the segmented guard walls.

BRIEF DESCRIPTION OF THE DRAWINGS

The features, aspects, and advantages of the present invention will become more fully apparent from the following Detailed Description, appended claims, and accompanying drawings in which:

FIGS. 2a, 2b, and 2c illustrate cross-sectional views through the semiconductor wafer of FIG. 1 exhibiting different types of delamination of a passivation layer and of a terminal metal layer;

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Figure 1:
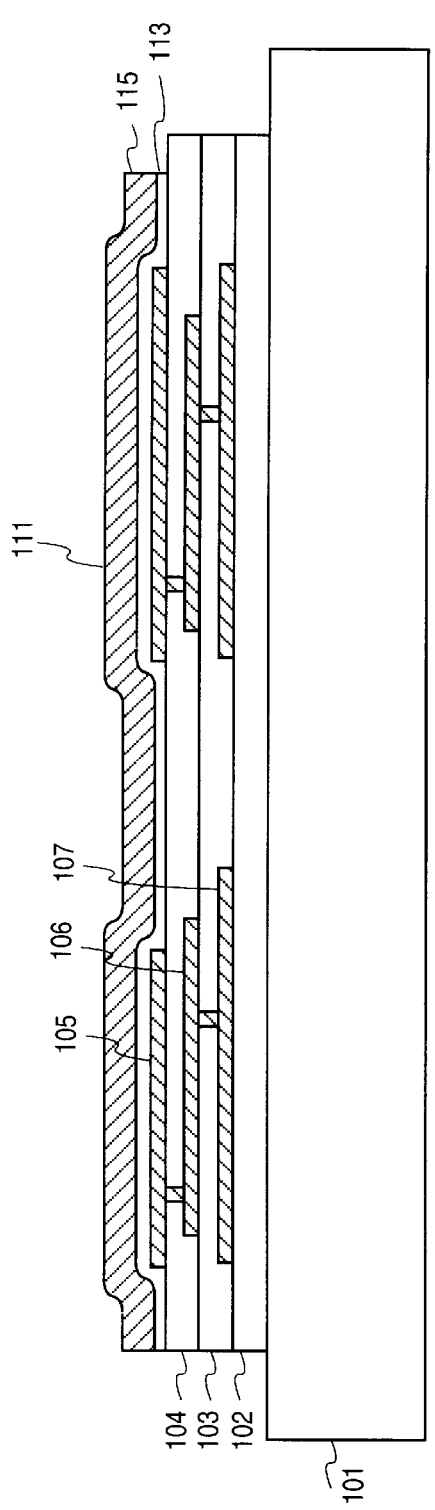
FIG. 1 shows a cross-sectional view through a semiconductor wafer.
Figure 2A:
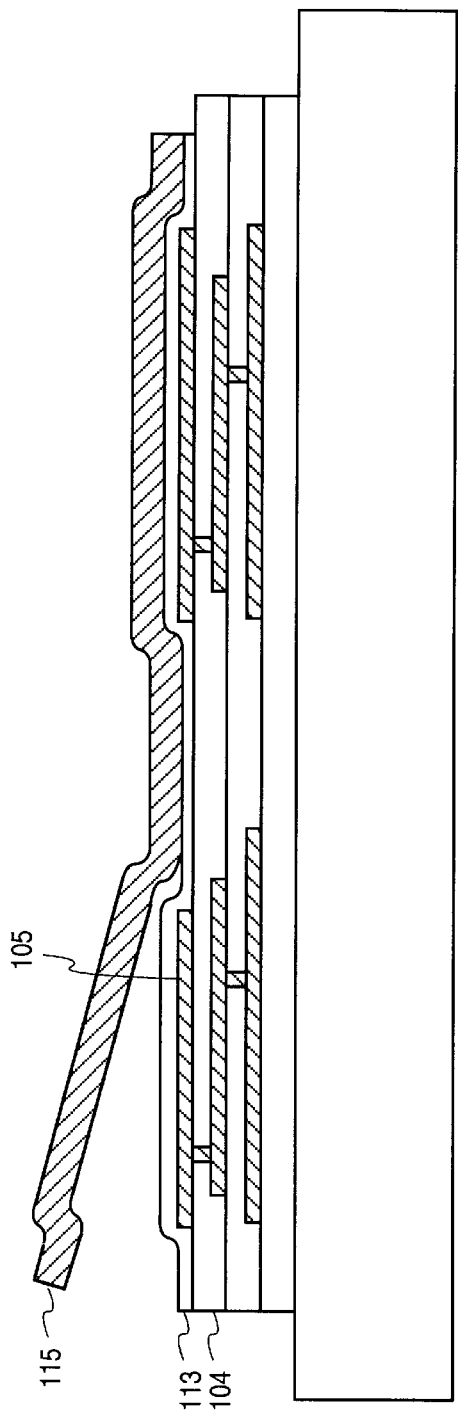
Figure 3:
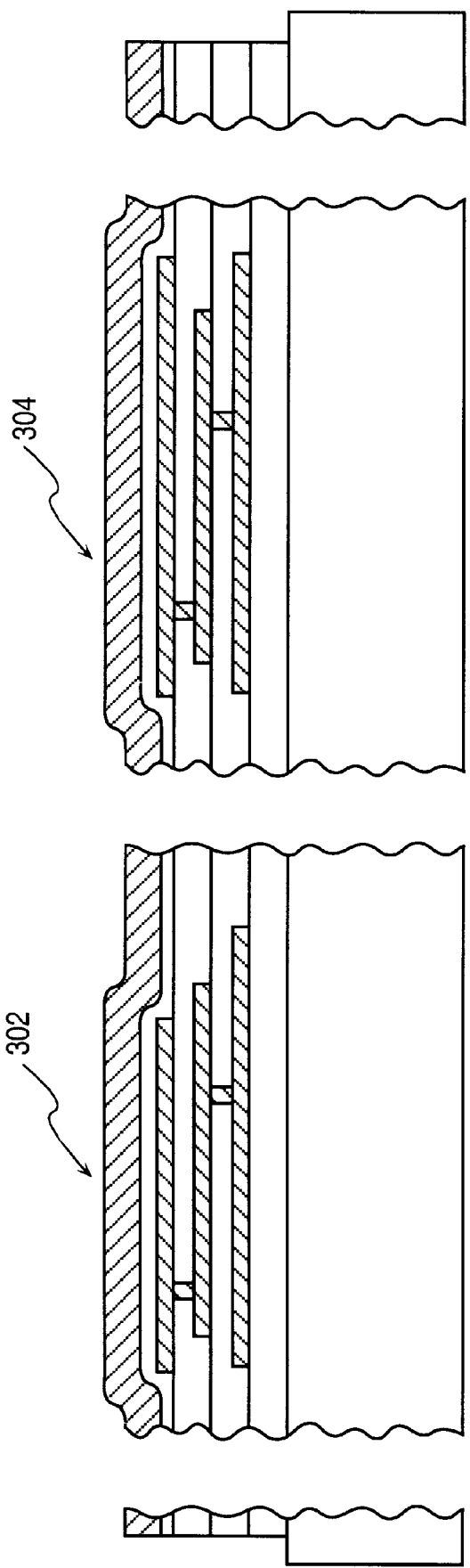
FIG. 3 illustrates a cross sectional view through a semiconductor wafer that has a plurality of computer chips formed therein that are separated by a sawing process.
Figure 4:
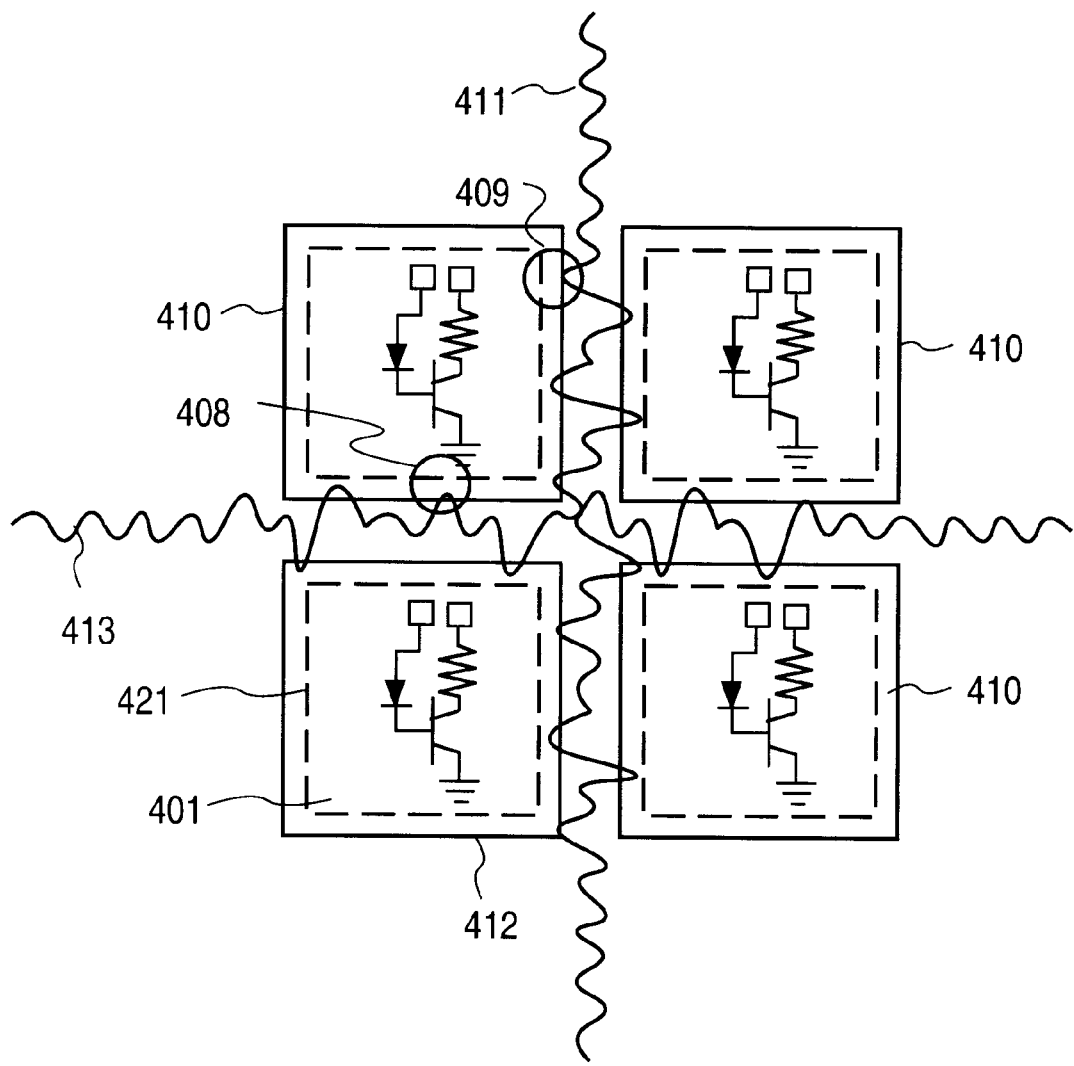
FIG. 4 illustrates a top view of four dies of a wafer separated therebetween by cuts resulting from a sawing process.
Figure 5:
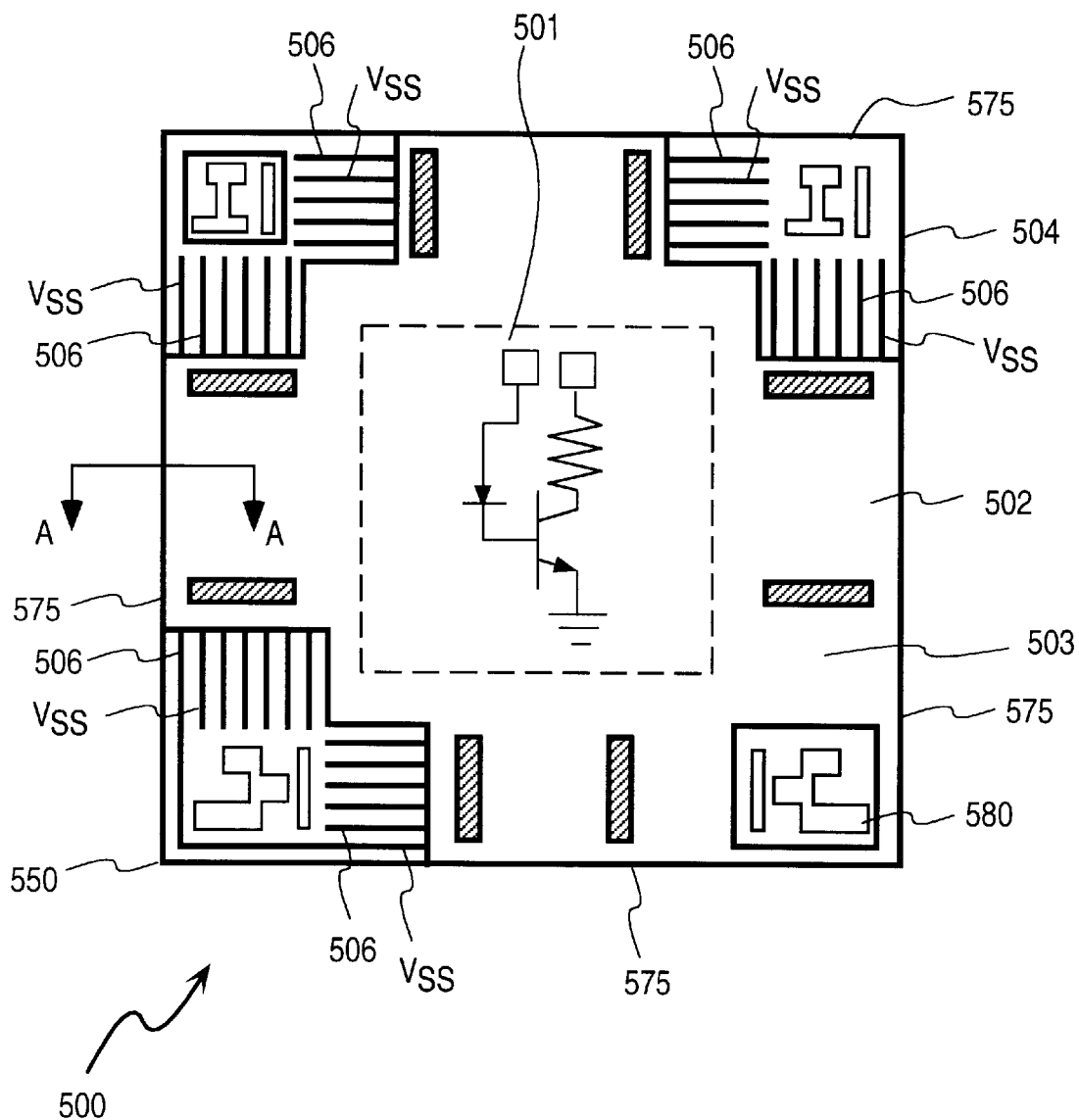
FIG. 5 illustrates a top view of an embodiment of an integrated circuit according to the present invention.

FIG. 5 illustrates a top view of an embodiment of a die (integrated circuit) 500 according to the present invention. The integrated circuit includes a silicon substrate (not shown) upon which dielectric and metal layers are formed. The metal layers are interposed between the dielectric layers. A terminal metal layer (TML) 502 is formed upon a terminal dielectric layer 503. Terminal dielectric layer 503 is the most remote layer of dielectric, in a vertical direction perpendicular to the Figure, from the silicon substrate. TML 502 is the most remote layer of metal, in a vertical direction perpendicular to the Figure, from the silicon substrate.

TML includes a continuous guard ring 504 that surrounds a die active area 501 of the integrated circuit. The die active area 501 includes active and passive electrical structures that form electrical circuits. To prevent a passivation layer (not shown) from delaminating from guard ring 504, or to prevent the guard ring 504 and the passivation layer from delaminating from the terminal dielectric layer 503, the embodiment of the integrated circuit of the present invention described herein includes a plurality of metal locking structures 506 formed out of the terminal metal layer 502. The locking structures 506 are metal segments made out of the TML, electrically insulated from the die active area 501, formed outside the die active area in the vicinity of edges 575 of the IC, and in the vicinity of corners 550 of the IC. The embodiment of the present invention described herein includes guard ring 504, which encloses the die active area 501 and locking structures 506

A passivation layer is formed upon guard ring 504 and the locking structures 506. The locking structures 506 provide an increased level of adherence of the passivation layer to the integrated circuit, i.e., an increased level of adherence of the passivation layer to the last layer of dielectric 503 and to guard ring 504. Structures 580 placed at the corners of the die 500, may be used for pattern recognition.

Each locking structure 506 is coupled to a voltage supply such as $V_{SS}$ or $V_{CC}$ to reduce stray charges built up on the locking structures 506 thereby minimizing the capacitive impact that may be introduced by locking structures 506. Note that the present invention is not limited to an integrated circuit with a guard ring 504. The scope of the present invention also covers integrated circuits with no guard ring 504, but with locking structures 506 formed in the terminal metal layer 502 in the vicinity of edges 575 of the IC.

Figure 6:
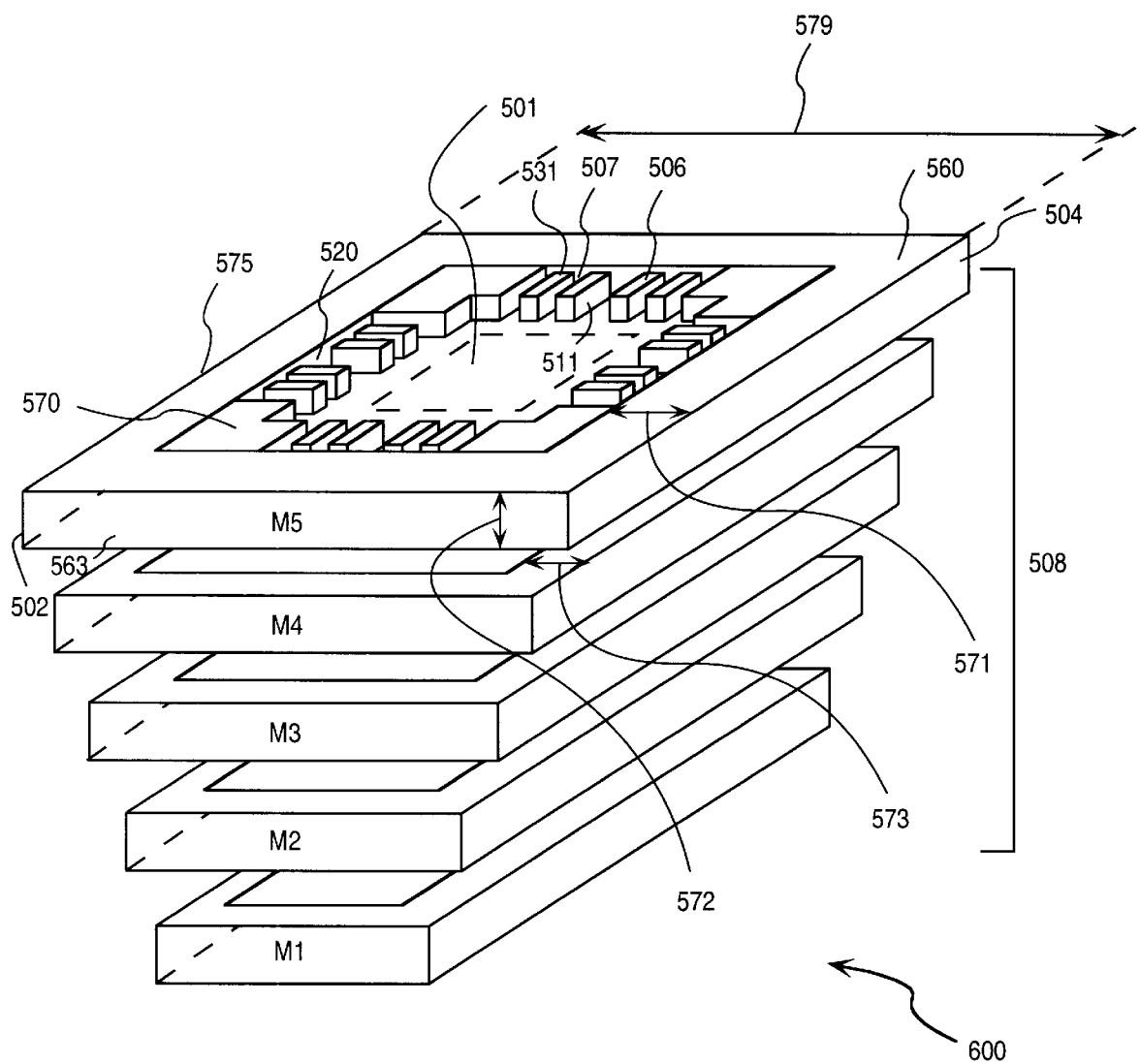
FIG. 6 illustrates a simplified top and lateral view of an embodiment of an integrated circuit with locking structures according to the present invention.

FIG. 6 illustrates a simplified top and lateral view, taken through line A–A' of FIG. 5, of an embodiment of an integrated circuit (IC) 600 with locking structures 506 according to the present invention. Integrated circuit 600 includes metal layers (M1, M2, M3, M4, M5) interposed between layers of dielectric (not shown). M5 is a terminal metal layer (TML) 502 and includes a guard ring 504 formed out of TML layer 502. A guard wall 508, including guard ring 504, surrounds die active area 501. Note that the present invention also applies to an IC that only has one layer of metal and one layer of dielectric.

The guard wall 508 is "carved out" of the terminal layer (M5) and of the rest of the metal layers (M4, M3, M2, M1) of the integrated circuit 600. A plurality of locking structures 506 are formed out of the TML 502 to increase a level of adherence of the passivation layer (not shown). Each locking structure 506 has a surface (adhering surface) that includes two lateral surfaces 511 and one top surface 531. Surfaces 531 and 511 increase the area of adherence of the IC with a passivation layer. Guard ring 504 includes top surface 560, lateral external surface 563 and lateral inner surface 520. Therefore the embodiment of the IC 600 according to the present invention, provides extra adhering surfaces offered by locking structures 506 in addition to the above-mentioned surfaces of the guard ring. The locking structures 506 do not interface with the active area, as they are placed outside the active area and are electrically insulated.

In the embodiment of the present invention described herein, locking structures 506 and guard ring 504 are formed by using processes well-known in the art such as photolithography, patterning, etching, etc. The locking structures 506 upwardly extend from a top surface of the terminal dielectric layer (not shown). It has been found that for better performance, a width of the locking structures 506 is larger than the space 507 between two consecutive locking structures. A good ratio of width-to-space for locking structures 506 may be 3×1. In one embodiment according to the present invention, the die has a rectangular shape, the guard ring 504 has a rectangular loop shape, and the locking structures 506 include parallelepipedical segments. In one embodiment of the present invention, each locking structure is parallel to two opposing sides 575 of the guard ring 504. The placement of locking structures 506 near the corners of the die and close to guard ring 504 is strategical, in that typically stress concentration is higher at the corners and edges of the die due to the lower density of metal structures per unit of surface. The locking structures need not be disposed near all corners of the die, but only near those corners of the die that are more susceptible to damage, such as the corners where the density of metal structures per unit of surface is lower.

In the embodiment according to the present invention explained herein, the width 571 of a side of guard ring 504 is larger than width 573 of a side of a guard ring formed in metal layer $M_4$. In the embodiment of the present invention described herein, the width 571 is approximately 6 $\mu$m, while width 573 is approximately equal to 4 $\mu$m. The widths of the other metal layers ($M_1$–$M_3$) are equal therebetween and measure approximately 4 $\mu$ms. In some other embodiments according to the present invention, the widths of guard rings of metal layers $M_4$, $M_3$. $M_2$, and $M_1$ may progressively decrease. By having a wider guard ring 504, adhesion between the passivation layer and guard ring 504 is increased. Also, it has been found that a wider guard ring 504 makes the guard wall 508 stronger. In one embodiment according to the present invention, TML is made of Aluminum/Copper. The guard ring 504 and locking structures 506 may have a height 572 of approximately 3 $\mu$m. A length of the locking structures is in the approximate range of 10 to 20 $\mu$m m. A width of the die 579 may have a size of approximately ½ centimeters but such size is not limited to ½ centimeters.

Figure 7:
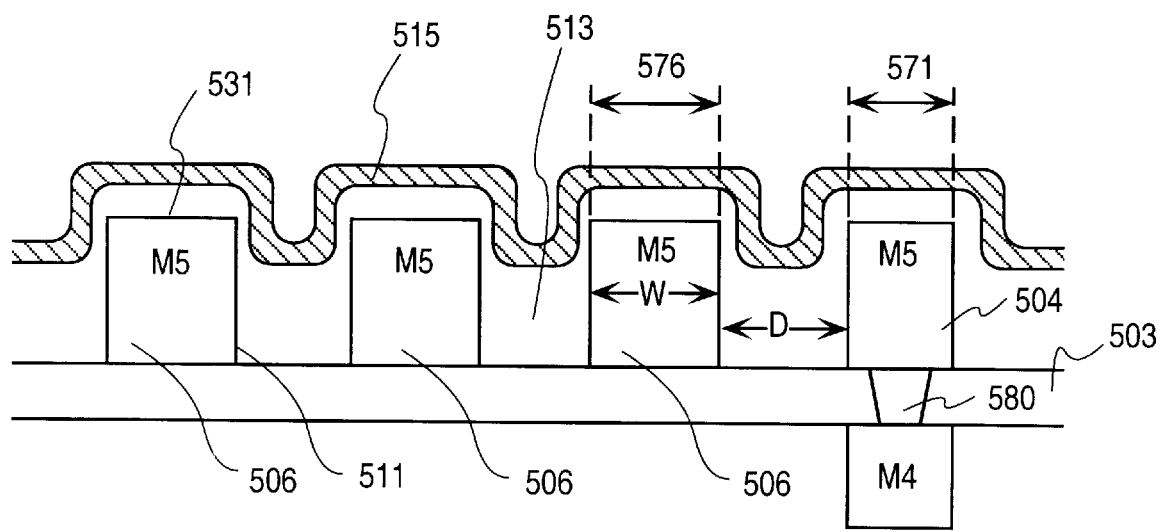
FIG. 7 shows a cross sectional view through a top part of an integrated circuit according to the present invention.

FIG. 7 shows a cross sectional view through a top part of an integrated circuit according to the present invention. A terminal metal layer (TML) has a plurality of metal locking structures 506 and a guard ring 504 formed therein. These structures are formed by standard processes including, patterning the TML, etching the TML, etc. Guard ring 504 is formed towards an edge (side) of the die. A passivation layer including a hard passivation layer 513 and a soft passivation layer 515 is formed upon and between locking structures 506 and guard ring 504. The passivation layer adheres to the top 560 and lateral surfaces 520 and 563 of the guard ring 504 and the top 531 and lateral surfaces 511 of locking structures 506. A width 571 of the guard ring is approximately 6 $\mu$m. A width 576 of the locking structures has a size in the range of approximately 5–15 $\mu$m. The metal layer M5 is connected to metal layer M4 by way of via 580.

Figure 8:
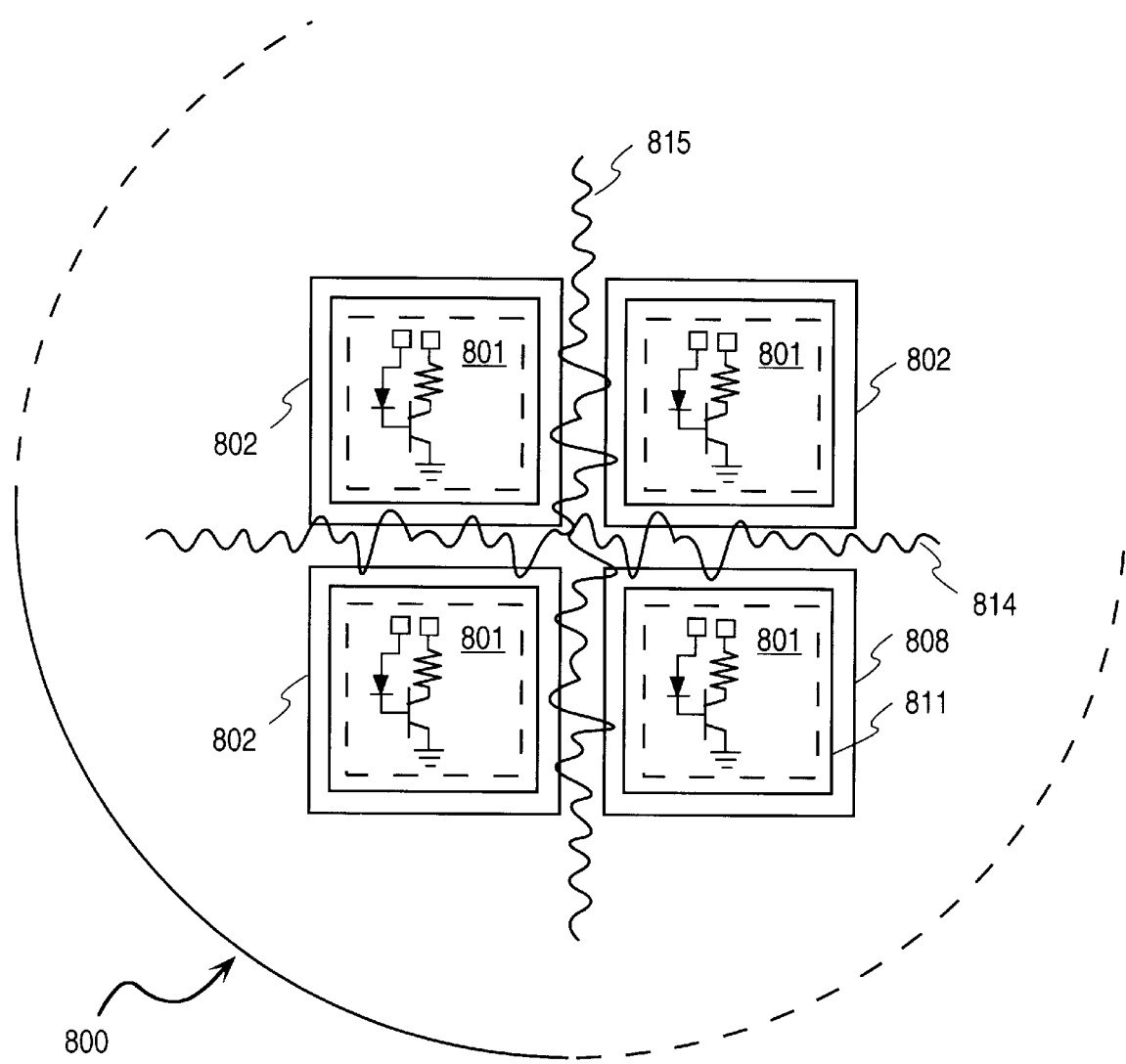
FIG. 8 illustrates a top view of a portion of a wafer that includes four adjacent chips.

The chips of the wafer are typically separated by a sawing process which may cause damage to the guard ring or to the die active areas. Microcracks initiated during the wafer saw process may propagate into the die active area causing damages to this area. FIG. 8 illustrates a top view of a portion of a wafer 800 that includes four adjacent chips (integrated circuits) 802. Each integrated circuit 802 includes a silicon substrate, a plurality of device layers and metal layers formed upon the silicon substrate, and a first guard wall 811 formed at a periphery of the metal layers and enclosing a die active area 801. Furthermore, in an embodiment of a wafer with integrated circuits according to the present invention, each IC includes a second guard wall (sacrificial guard wall) 808 formed out of metal layers ($M_1$, $M_2$, $M_3$, $M_4$, $M_5$). The sacrificial guard wall 808 encloses the first guard wall 801. The sacrificial guard wall 808 may typically be made of the same metal layers of which the first guard wall 811 is made. The sacrificial guard wall 808 prevents sawing cuts 814 or 815 from producing damages to first guard wall 811. By having sacrificial guard wall 808 surrounding or enclosing first guard wall 811, the embodiment of the present invention substantially prevents damages to the first guard wall and implicitly to the die active area 801 had the integrated circuit not included the sacrificial guard wall and the saw directly impacted the first guard wall. The first guard wall 811 is thus "buffered" by sacrificial guard wall 808 that, when intersected by a saw that produces a cut therethrough, substantially prevents a saw cut from affecting the first guard wall.

Figure 9:
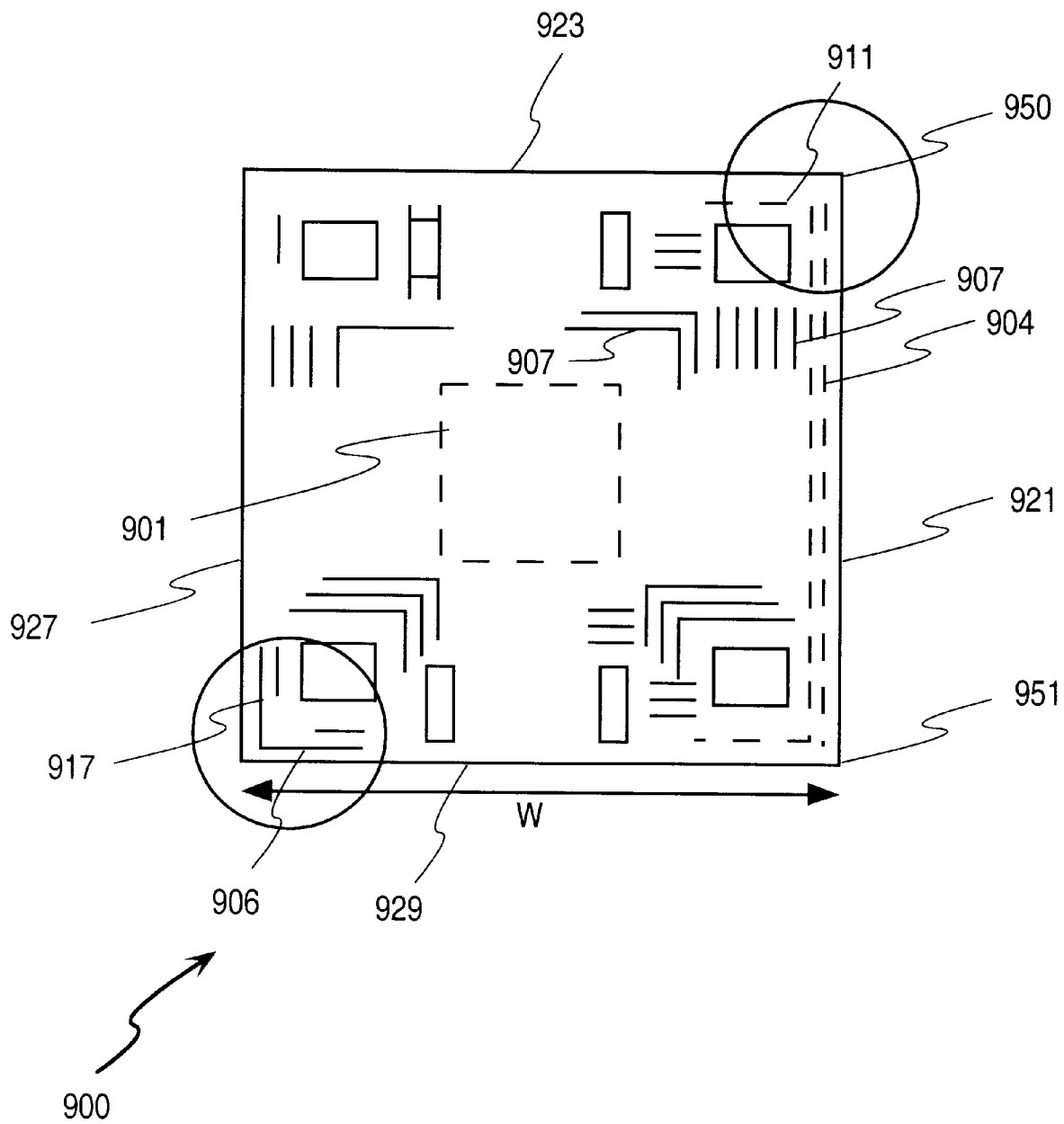
FIG. 9 illustrates a top view of an integrated circuit with a plurality of energy absorbing structures according to the present invention.

Furthermore, the present invention provides an embodiment of an integrated circuit (die) 900 with a plurality of energy absorbing structures shown in FIG. 9. The energy absorbing structures are made out of a terminal metal layer (TML) of the die 900. These energy absorbing structures are made much in the same way the locking structures are made. The above-presented discussion with respect to the locking structures applies herein. The energy absorbing structures are strategically placed on a die to absorb saw energy which may damage a die active area. As explained above, it has been found that the corners of the die and the sides (edges) of the die are more susceptible to damage. One type of energy absorbing structure (shown in a circle at top right corner of the die) includes a plurality of small segments 911 of metal that run parallel to two perpendicular sides of the die 921 and 923, near the corner of the die. Another type of energy absorbing structure includes segments 950 placed at the sides of the die and running along each edge 921 of the die, from one corner 950 to another adjacent corner 951. Different shapes may be conceived for these segments. Another type of energy structure is shown in a circle at the bottom left corner of the die. This type of energy absorbing structure includes two continuous perpendicular segments 906 and 917 joined therebetween. Segments 906 and 917 run parallel to sides 929 and 927 respectively. The energy absorbing structures may be disposed within a guard ring coinciding with edges 292 to absorb energy resulting from the separation of the chips from the wafer. A relation between the width of the energy absorbing structures and the space therebetween may be similar with the relation mentioned above, where the ratio of the widths of the energy absorbing structures to the space therebetween is 3 to 1.

Figure 10:
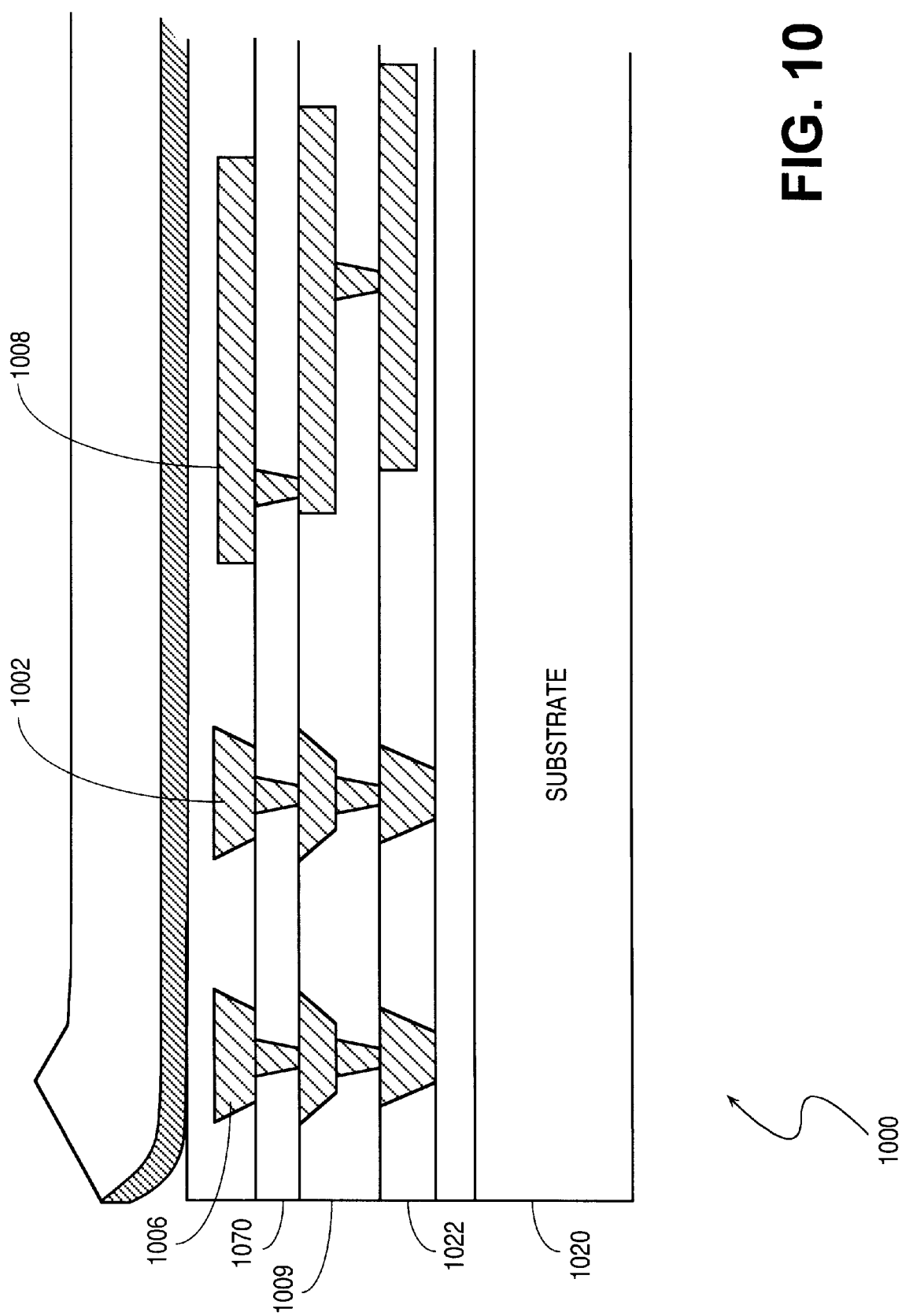
FIG. 10 illustrates a cross sectional view through an integrated circuit according to the present invention with a stapling structure according to the present invention.
Figure 11:
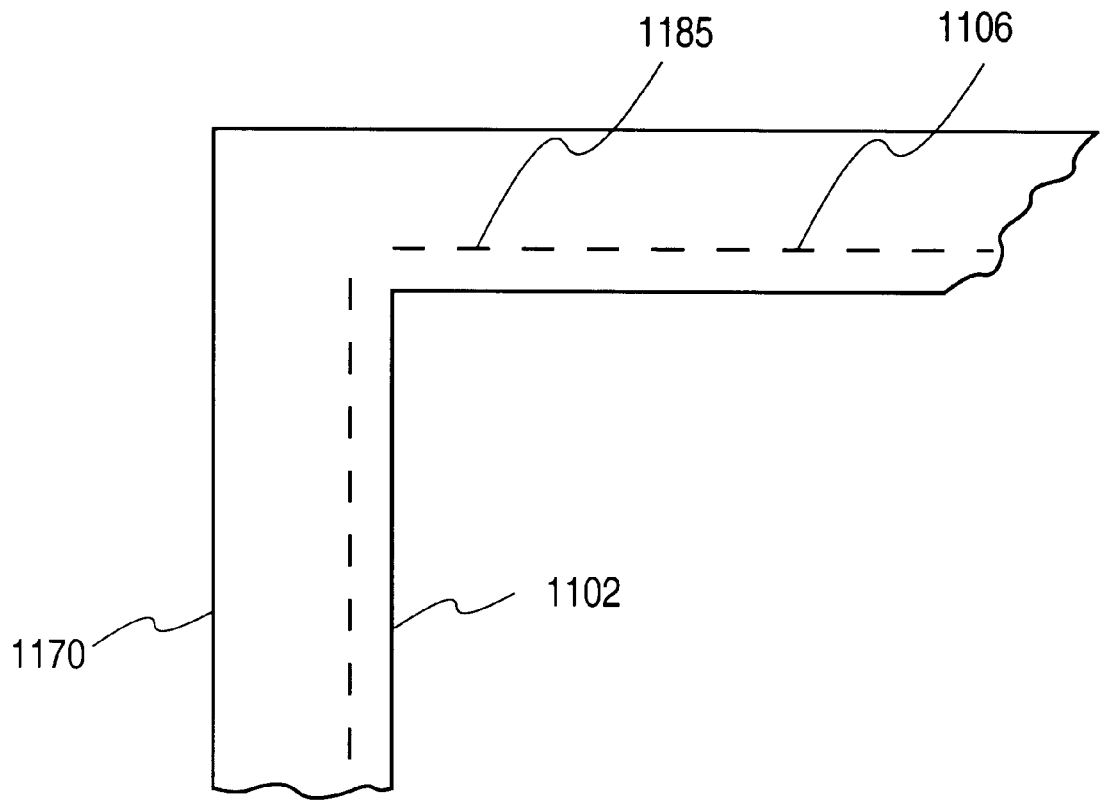
FIG. 11 illustrates a top view of an embodiment of an integrated circuit with one guard ring and a segmented stapling structure according to the present invention.

FIG. 10 illustrates a cross sectional view through an integrated circuit (IC) 1000 according to the present invention with a stapling structure 1006 configured to reduce or prevent interlayer delamination. The integrated circuit according to the present invention includes a guard wall 1002 and a stapling structure 1006 placed between a periphery 1070 of the die and guard wall 1002. Stapling structure 1006 holds together the layers of dielectric and metal of IC 1000. Stapling structure 1006 is similar to a guard wall, in that it runs through the dielectric and metal layers of the IC. Stapling structure 1006 of the IC 1000 according to the present invention is a segmented structure as shown in FIG. 11. FIG. 10 also illustrates a silicon substrate 1020 upon which interspersed metal layers 1008, 1016 and 1018 and dielectric layers 1009, 1010, 1012, 1014 and 1022 are formed. Stapling structure 1006 and guard wall 1002 are formed from the metal layers shown in the figure.

FIG. 11 shows a top view of a portion of a die (IC) that has a guard wall 1102 and a segmented stapling structure 1106 (segmented guard wall) routed around guard wall 1102 to prevent interlayer delamination when mechanical forces are applied to the die. The segmented stapling structure is advantageous over a continuous structure, as the smaller are the portions of the stapling structure, i.e., segments 1185, the higher is the resistance to external forces. The segment 1185 shown in the figure are part of a terminal metal layer (TML) and of the segmented stapling structure 1106. The segments 1185 enclose a guard ring formed in the TML.

Figure 12:
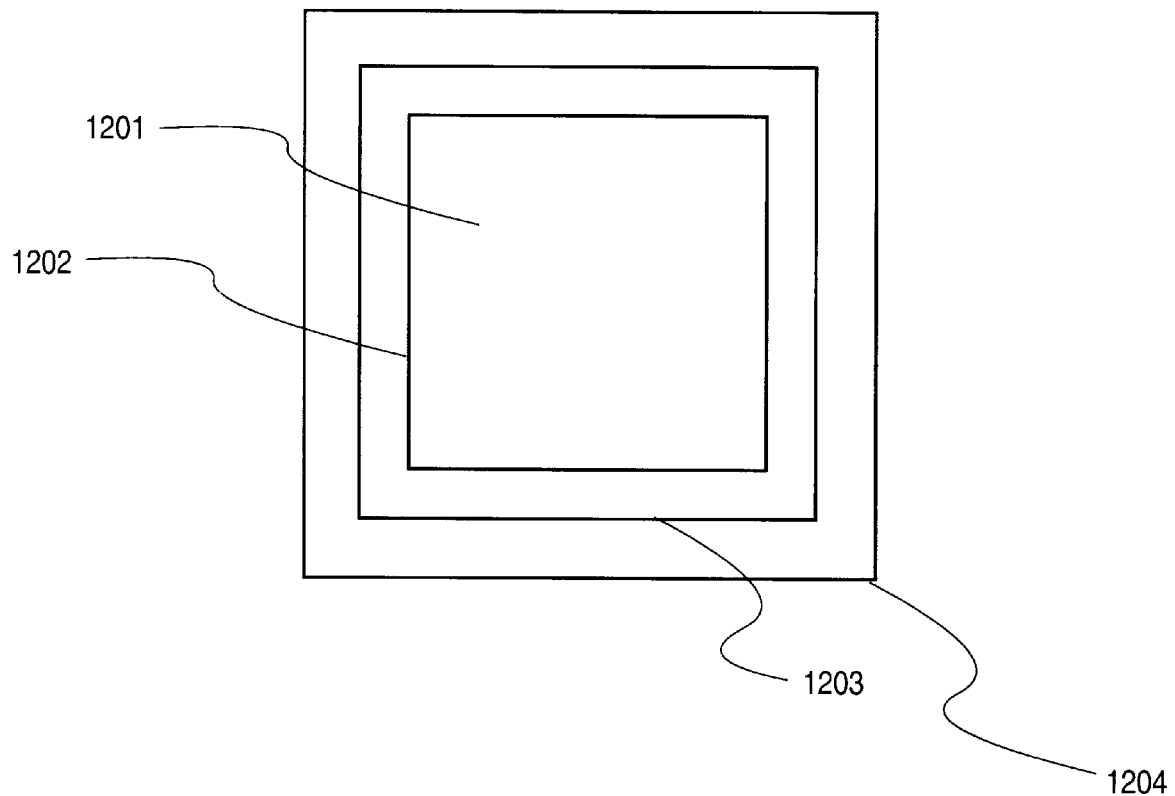
FIG. 12 illustrates a top view of embodiment of an integrated circuit (IC) with three guard rings according to the present invention.

FIG. 12 illustrates a top view of an embodiment of an integrated circuit die with three guard rings according to the present invention. A terminal metal layer (TML) formed on a top dielectric layer includes a first guard ring 1202 formed in the TML. First guard ring 1202 surrounds the die active area 1201. A second guard ring 1203, formed within the TML, surrounds the first guard ring and protects the first guard ring against damages that may occur as a result of sawing, separation of a wafer into a plurality of chips, etc. A third guard ring 1204 is formed within the TML and surrounds the second guard ring 1203 to protect second guard ring 1203 from damages. The third guard ring provides extra protection, in case the third guard ring was absent and both the second and first guard rings were damaged. The number of guard rings surrounding a die active area is not limited to "3". Any number of guard rings may be utilized depending on the desired size of the integrated circuit.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An integrated circuit (IC) comprising:
    a silicon substrate;
    a plurality of interspersed dielectric and metal layers formed upon said silicon substrate, said plurality of interspersed dielectric and metal layers forming a die active area, said metal layers having formed therein a first guard wall surrounding said die active area, said metal layers further having formed therein a segmented guard wall, surrounding said first guard wall and stapling said plurality of metal layers; and
    a passivation layer adhering to said first and said segmented guard wall.

2. The IC of claim 1 wherein said segmented guard wall includes a plurality of segments surrounding said die active area.

3. The IC of claim 1 including a terminal metal layer (TML), said TML having a guard ring formed therein, said guard ring having a rectangular shape.

4. The IC of claim 3 wherein said TML includes segments that are part of said segmented guard wall, said segments enclosing said guard ring.

5. The IC of claim 1 wherein the passivation layer includes a layer of silicon nitride and a layer of polyimide.

6. The IC of claim 4 wherein a number of said segments are parallel to a side of a rectangular guard ring.

7. The IC of claim 1 wherein said segmented guard wall is formed by patterning and etching said terminal metal layer.

8. The IC of claim 1 wherein said TML layer is made of aluminum/copper.

9. The IC of claim 1 wherein said segmented guard wall is made of various layers of conductive material $M_1$, $M_2$, $M_3$, $M_4$, and $M_5$.

10. The IC of claim 1 wherein said guard ring has a width of approximately 6 $\mu$m.

11. A wafer comprising:
    a plurality of chips, each chip including:
        a silicon substrate;
        a plurality of interspersed dielectric and metal layers formed upon said silicon substrate, said plurality of interspersed dielectric and metal layers forming a die active area, said metal layers having formed therein a first guard wall surrounding said die active area, said metal layers further having formed therein a segmented guard wall, surrounding said first guard wall and stapling said plurality of metal layers; and
        a passivation layer adhering to said first and said segmented guard wall.

12. The wafer of claim 11, said segmented guard wall includes a plurality of segments surrounding said die active area.

13. The wafer of claim 11 each chip including a terminal metal layer (TML), said TML having a guard ring formed therein, said guard ring having a rectangular shape.

14. The wafer of claim 13, said TML includes segments that are part of said segmented guard wall, said segments enclosing said guard ring.

15. The wafer of claim 11, the passivation layer includes a layer of silicon nitride and a layer of polyamide.

16. The wafer of claim 14, a number of said segments are parallel to a side of a rectangular guard ring.

17. The wafer of claim 11, said segmented guard wall is formed by patterning and etching said terminal metal layer.

18. The wafer of claim 11, said TML layer is made of aluminum/copper.

19. The wafer of claim 11, said segmented guard wall is made of $M_1$, $M_2$, $M_3$, $M_4$, and $M_5$.

20. The wafer of claim 11, said guard ring has a width of approximately 6 $\mu$m.

* * * * *